(12) United States Patent
Dinh

(10) Patent No.: US 6,212,086 B1
(45) Date of Patent: Apr. 3, 2001

(54) PACKAGING OF A DC-TO-DC CONVERTER

(75) Inventor: James S. Dinh, Gig Harbor, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/083,564

(22) Filed: May 22, 1998

(51) Int. Cl.⁷ .................................................. H02M 1/00
(52) U.S. Cl. ............................................ 363/144; 363/146
(58) Field of Search .................................. 363/146, 144; 361/687, 688, 760, 719, 720

(56) References Cited

U.S. PATENT DOCUMENTS

| | | | |
|---|---|---|---|
| 4,738,024 | * 4/1988 | Eberhardt | 361/386 |
| 5,159,700 | * 10/1992 | Reid et al. | 385/14 |
| 5,184,281 | * 2/1993 | Samarov et al. | 361/386 |
| 5,282,114 | * 1/1994 | Stone | 361/687 |
| 5,616,888 | * 4/1997 | McLaughlin et al. | 361/761 |

\* cited by examiner

*Primary Examiner*—Jessica Han
(74) *Attorney, Agent, or Firm*—Howard A. Skaist

(57) ABSTRACT

Briefly, in accordance with one embodiment of the invention, a DC-to-DC converter package includes: a DC-to-DC converter circuit. The components of the DC-to-DC converter circuit that perform high frequency switching during converter operation are surface mounted on a printed circuit board (PCB) so that the heat produced from the high frequency switching is approximately equally distributed at least over the portion of the PCB where the components are mounted.

15 Claims, 4 Drawing Sheets

PACKAGING OF A DC-TO-DC CONVERTER

BACKGROUND

1. Field

The present invention relates to packaging, and more particularly, to packaging for a DC-to-DC converter.

2. Background Information

Direct-current (DC) to direct-current (DC) converters are well-known in the art. Such circuitry or devices are typically employed to convert from one DC voltage signal level to another DC voltage signal level. This may be useful in a variety of environments. A number of such converters are well-known.

Conventionally, a DC-to-DC converter package includes a bulky heat sink to dissipate the heat generated by the switching of transistors during converter operation. Typically, a heat sink is employed to manage the thermal considerations related to the converter. Likewise, traditionally thick printed circuit board traces or wire harnesses are employed. Of course, these aspects of conventional packaging affect space considerations, weight considerations, as well as thermal and other considerations with respect to the DC to DC converter package. In addition, due to the nature of the operation of the DC-to-DC converter, capacitors, such as input capacitors and output capacitors, are typically included on the printed circuit board to handle the dynamic response of the converter. This also affects cost considerations, in addition to the foregoing considerations, such as the cost of materials and labor, to produce the DC-to-DC converter package. It would be desirable if an alternative approach to packaging existed that reduced the size and weight of the DC-to-DC converter package, as well as addressing these other considerations, such as heat and dynamic response.

SUMMARY

Briefly, in accordance with one embodiment of the invention, a DC-to-DC converter package includes: a DC-to-DC converter circuit. The components of the DC-to-DC converter circuit that perform high frequency switching during converter operation are surface mounted on a printed circuit board (PCB) so that the heat produced from the high frequency switching is approximately equally distributed at least over the portion of the PCB where the components are mounted.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Figure 3:
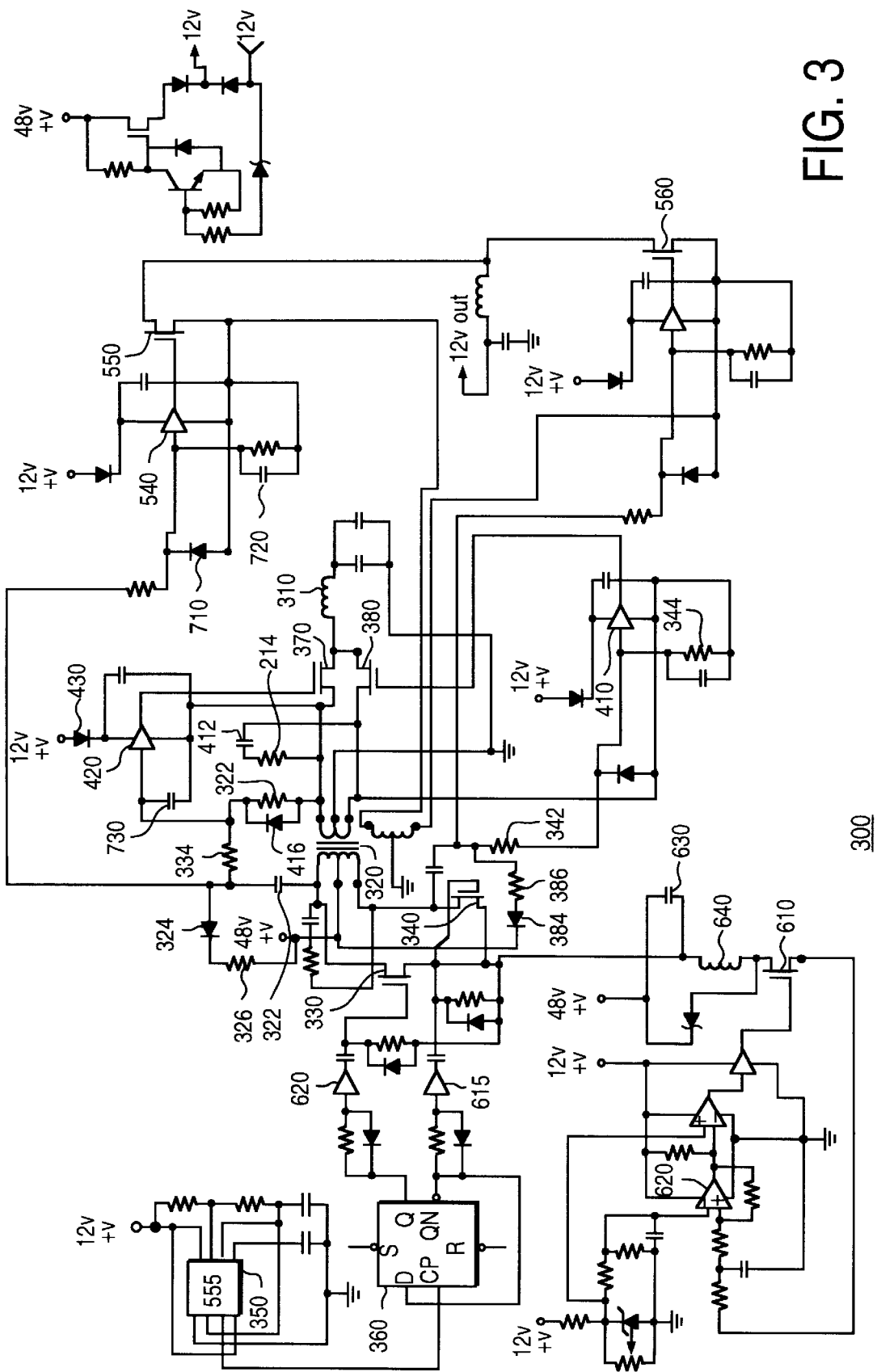
FIG. 3 is a circuit diagram illustrating an embodiment of a DC-to-DC converter circuit.

FIG. 3 is a circuit diagram illustrating an embodiment 300 of a DC-to-DC converter in accordance with the present invention. This particular embodiment comprises a synchronous rectifier converter that shall be described in greater detail hereinafter. The synchronous rectifier converter includes a buck converter, in this particular embodiment on the primary side of the transformer. Of course, the synchronous rectifier converter is not limited in scope to employing a buck converter. Furthermore, some alternative embodiments may not comprise a synchronous rectifier converter. The transformer of the synchronous rectifier converter in this particular embodiment employs less than five windings on the secondary. Specifically, in this embodiment, the transformer employs one winding on the secondary, although the invention is not limited in scope in this respect. Likewise, this particular synchronous rectifier converter includes an inductor, such as inductor 310. Like transformer 320, in this particular embodiment, inductor 310 employs less than five windings, here, a single winding, although, again, the invention is not limited in scope in this respect. In this particular embodiment, the synchronous rectifier converter comprises a push/pull synchronous rectifier converter and the buck converter comprises a circuit configuration to step-down the voltage applied to the primary side of the transformer. As shall be explained in more detail hereinafter, by employing this configuration, the synchronous rectifier converter is able to accommodate a load current on the order of tens of amps, while also providing a relatively low voltage. Specifically, this embodiment is capable of accommodating a load current above approximately 60 amps, although, of course, the invention is not limited in scope in this respect.

The primary of transformer 320 is driven by metal-oxide semiconductor field effect transistors (MOSFETs) used to switch the primary to ground with approximately a 50% duty cycle on each MOSFET gate, in particular, MOSFETs 330 and 340 in FIG. 3, although the invention is not limited in scope in this respect. In this particular embodiment, a synchronous rectifier push/pull converter is employed because such converters may accommodate a higher duty cycle than other types of converters, such as a forward converter. An advantage of a high duty cycle is that it provides a greater amount of power, relatively speaking, which may improve the speed of response at the load of the converter. Likewise, such converters are typically relatively efficient, as shall be described in more detail later. In this particular embodiment, the switching signal is produced by a precision 555 timer 350, such as a Texas Instruments' SE555D device, available from Texas Instruments Corp., Dallas, Tex., or equivalent, which may be employed to provide a square wave signal to a, for example, divide by two D- type flip-flop 360. In this particular embodiment, the 555 timer 350 produces a switching signal with approximately a 50% duty cycle which is then applied to a D-type flip-flop, as illustrated. The output signal of this D-type flip-flop (Q and QN) is then applied to MOSFET drivers 610 and 620, such as, for example, the MIC4427(Micrel) MOS- FET drivers, although the invention is not limited in scope in this respect. The output signals of these drivers turn switching MOSFETS 330 and 340 "on" and "off" at an approximate 50% duty cycle. Of course, the invention is not limited in scope to producing a switching signal using this technique. Any one of a large number of techniques and components may be employed.

Although the invention is not limited in scope in this respect, the converter is designed to produce 1.5 volts for the secondary load. The electrical signal induced in the secondary of the transformer is rectified synchronously by MOSFETs in order to reduce losses in the secondary circuit. For example, the resistance across a synchronously rectified transistor is lower than across a diode for approximately the same amount of current and, therefore, reduces power loss. As illustrated for MOSFETs 370 and 380, the gate signal applied is derived from the high-voltage primary side of transformer 320, which has been clamped, divided down and applied to the input port in the MOSFET drivers 420 and 430. Regulation of the 1.5 volt output signal of the synchronous rectifier converter is provided by a buck type converter. The buck converter in this embodiment regulates the source voltage for the primary side MOSFET switches 330 and 340. The high-voltage primary side of transformer 520 is clamped to a +48 volt rail in this embodiment through capacitor 322, diode 324, and resistor 326, is divided down to less than 12 V through resistors 332 and 334 with respect to the source of the synchronously rectified MOSFETs 370, and is applied to the MOSFETs driver 320. The gate signal applied to 380 is clamped to +48 V through capacitor 382, diode 384, and resistor 386 and is divided down through resistors 342 and 344, again, in this particular embodiment. In this particular embodiment, there are nine MOSFETs on each side of the secondary, and a driver for every nine MOSFETs, although, of course, the invention is not limited in scope in this respect. Likewise, during the negative power portion of the cycle for the secondary circuit, the voltage signal is applied to the driver to fully turn off the MOSFETs when the secondary circuit is on this portion of its cycle. As illustrated in FIG. 3, a 12 volt power source is applied to the driver through a diode 430 and bypass capacitor 440. The capacitor may also provide storage when the secondary circuit is on the positive portion of its cycle. As illustrated, the negative side of the capacitor is coupled to the secondary circuit and becomes charged to (12 volts minus the 1.5 volts secondary negative voltage minus the positive diode drop) to approximately 12.9 volts, in this particular embodiment.

When the secondary circuit is on the positive portion of its cycle, the corresponding primary side is likewise positive and the positive input signal is applied to the driver. This will result in the driver output signal achieving a voltage level of 12.9 volts above the 1.5 volt secondary output voltage level and turn on the MOSFETs for that side. Conversely, when the secondary circuit is on the negative portion of its cycle, the primary polarity is negative, resulting in the output signal of the driver transitioning low, to 1.5 volts in this particular embodiment, and turning off the MOSFETs. As illustrated, in this particular embodiment, the output voltage of the synchronous rectifier circuit is sensed by the buck converter, and will turn on the buck converter switching MOSFETs if the voltage level is too low, and turn them off if the voltage is too high. Hysteresis is provided via buck comparator 620 to provide two discrete switching levels for stability. As this voltage applied to the primary MOSFET source(s) increases, there is less voltage across the transformer primary, and so the output voltage decreases. Conversely, as the source voltage decreases, there is a greater voltage across the transformer primary, and the output voltage increases.

As shown FIG. 3, another secondary winding 520 is employed to provide 12 volts for control of this particular embodiment. Associated with this winding are drivers 530 and 540 and MOSFETs 550 and 560. This particular circuit also employs synchronous rectification and operates in a fashion analogous to the 1.5 volt secondary circuit. This particular circuit helps ensure that the transistors on both sides of the secondary winding are not "on" at the same time through capacitor 512, resistor 514, and diode 510 and capacitor 730, diode 710 and capacitor 720. Although the invention is not limited in scope in this respect, as illustrated, a "bootstrap" 12 volt source is employed which comprises a zener voltage regulator driving the gate of a 20N06 MOSFET, such as, for example, a Motorola MTD20N06HDL MOSFET, available from Motorola Corp., Schaumberg, Ill., which provides approximately 12 volts into a dual diode, which supplies 12 volts to the control circuitry. When the 12 volt section of the converter produces above 10 volts, the boot strap circuit is then shut off.

As previously indicated, in this particular embodiment, regulation of the converter is provided by a buck type converter, although the invention is not limited in scope in this respect. For example, although the invention is not limited in scope in this respect, a ripple IC controller, such as, for example, the Texas Instruments' SN104685DW controller, available from Texas Instruments Corp., Dallas, Tex. As previously indicated, the buck converter regulates the source voltage for the primary side MOSFET switches. The output voltage is sensed by the buck converter and will, therefore, turn on the buck switch MOSFET 610, if the voltage level is too low and turn it off if the voltage level is too high. Likewise, hysteresis is provided to the buck comparator to provide two discrete switching levels, for stability, as illustrated by comparator 620 and the circuit configuration coupled to its negative input port. Of course, the invention is not limited in scope to this particular circuit configuration.

Figure 4:
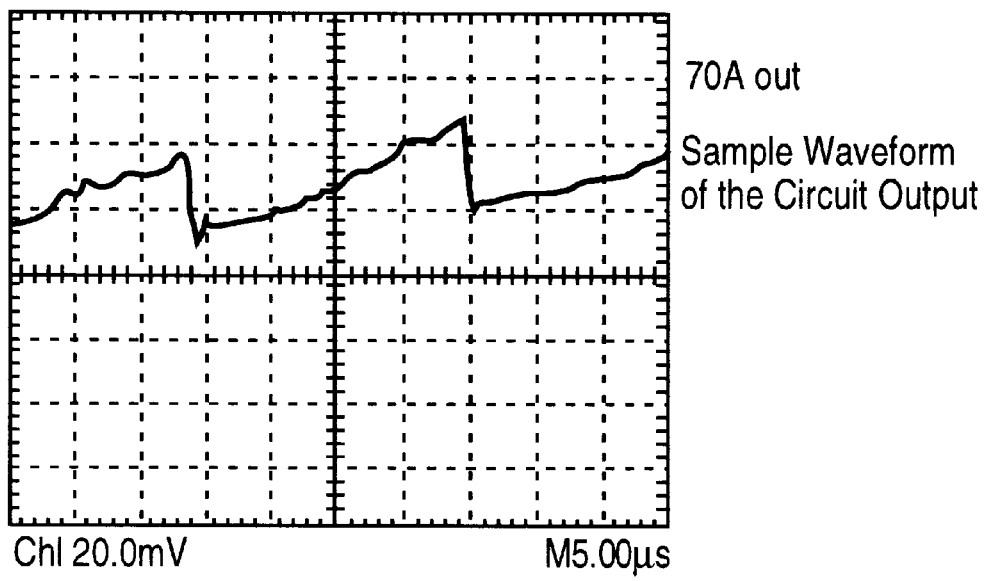
FIGS. 4 and 5 are plots of voltage signals produced by the circuit of FIG. 3.
Figure 5:
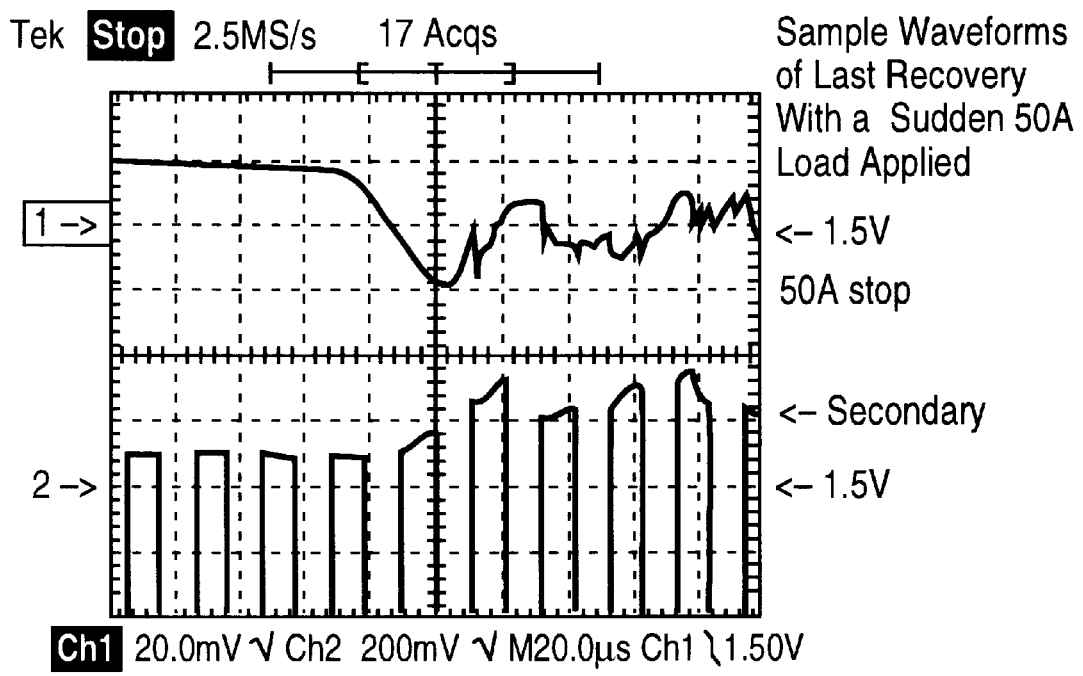

As previously indicated, the synchronous rectifier converter feedback operates as follows: as the voltage applied to the primary MOSFET source(s) increases, there is less voltage across the transformer primary and so the output voltage decreases. Conversely, as the source voltage decreases, there is a greater voltage across the transformer primary, and the output voltage increases. Therefore, as illustrated in FIG. 4, a typical ripple waveform is produced to be smoothed. In this embodiment, the 12 volt output signal is not separately regulated since small variations in its voltage will not affect operation significantly. As FIG. 5 illustrates, this particular embodiment has a relatively fast response time to maintain the output voltage within about 20 milli-volts with a positive offset of 20 milli-volts. In this embodiment, a 20 milli-volts offset is employed under no load condition so that when a 50 amp step load occurs, the output voltage will not drop below lower regulation limit of (1.5 V+/−1%) for this embodiment, and will have a droop of typically no greater than about 40 milli-volts with a 50 amp load step, although the invention is not limited in scope in this respect.

An aspect of the fast response relates to a small output capacitor 630 employed with the buck converter. This, however, may result in difficulties with recovery when the load is removed. The flux energy stored in inductor 640 may flow into the small value output capacitor and raise its voltage beyond specifications. In some embodiments, it may alternately be desirable to reduce the inductor value and increase the output capacitance or, alternatively, employ a form of transient suppression.

Embodiments of a DC-to-DC converter in accordance with the present invention provide several advantages. Due, at least in part, to the reduced number of windings, as previously described, the resistance of the forward path of the secondary circuit is relatively low. This provides the capability for the converter to accommodate a relatively large load current and a relatively small load voltage. If the resistance of the forward path were large, then a large step in current might result in the load voltage dropping to an unacceptably low level. In addition, this improves the efficiency of the converter, since less power is dissipated. Of course, one possible disadvantage is that the circuitry maybe more complex to smooth the ripple waveform produced by the reduced number of windings. The efficiency is also improved, as previously indicated, through the use of a synchronous rectifier in this particular embodiment. Likewise, as previously explained, this may also result in a higher duty cycle and associated faster response. A buck converter is employed in this particular embodiment to step down the voltage on the primary side of the transformer. This is desirable in this particular embodiment because the ratio of the input voltage to output voltage might otherwise produce an unacceptably short duty cycle. It will, of course, be appreciated that the invention is not limited to all the features described in this particular embodiment and many other embodiments with more features or less features are possible and desirable, depending on the particular situation.

An embodiment of a method of producing a high current, low voltage, direct current output or load signal in accordance with the present invention, such as in a DC-to-DC converter, for example, may be as follows. A switching power signal, such as a square, for example, as described in the embodiment of FIG. 3, for example, may be applied to the primary of a transformer having a single winding on its secondary, for example, as previously described. Of course, the invention is not limited in scope to this embodiment, such as a square wave or to a single winding. The power signal induced in the secondary of the transformer is synchronously rectified, and the synchronously rectified power signal is smoothed using an output circuit that has an output inductor with a single winding, again, in this particular embodiment. The duty cycle of the switching power signal applied to the primary is adjusted, at least in part, based on the voltage of the smoothed, synchronously rectified, induced secondary power signal. In one embodiment, as previously described, the duty cycle is adjusted using a buck converter. Furthermore, in one embodiment, the primary voltage of the transformer is stepped down before application to the buck converter, as described, for example, in the embodiment of FIG. 3.

Figure 1:
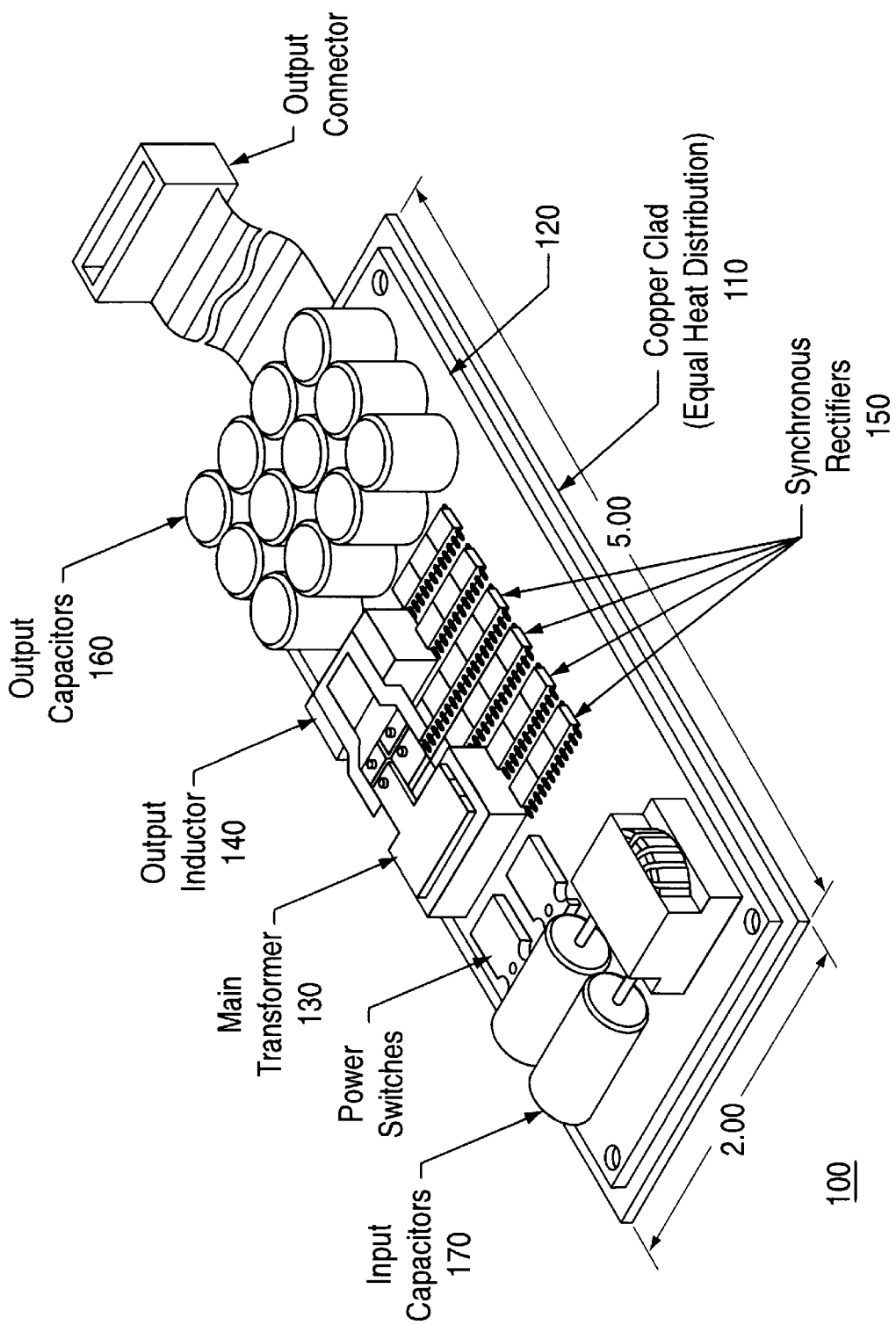
FIG. 1 is a perspective diagram illustrating an embodiment of a DC-to-DC converter package in accordance with the present invention.

FIG. 1 is a perspective diagram of one embodiment of a DC-to-DC converter package in accordance with the present invention. This particular embodiment employs the previously described embodiment of a DC-to-DC converter circuit, although the invention is not restricted in scope in this respect. An embodiment of a DC-to-DC converter package may employ other DC-to-DC converter circuits other then the foregoing, such as, for example, other high efficiency DC-to-DC converter circuits. Nonetheless, in this particular embodiment, the transformer of the DC-to-DC converter circuit has one winding on its secondary. Likewise, the DC-to-DC converter circuit has an output inductor and the output inductor has one winding as well. Likewise, as previously described, the DC-to-DC converter circuit comprises a synchronous rectifier converter that includes a buck converter on the primary of the transformer. Likewise, the synchronous rectifier converter comprises a push/pull synchronous rectifier converter circuit.

One advantage of using a high efficiency DC-to-DC converter circuit, such as the previously described DC-to-DC converter circuit, is that less heat is dissipated as a result of the improved efficiency. In this particular embodiment, this reduction in heat dissipation may be enhanced because the secondary of the transformer and the output inductor each employ only a single winding. Nonetheless, as illustrated in FIG. 1, while this embodiment of a DC-to-DC converter package does not employ a heat sink, merely employing a high efficiency DC-to-DC converter circuit, even the previously described high efficiency circuit, may not be sufficient to reduce the heat dissipation to accomplish this result, by itself.

The embodiment of FIG. 1 illustrates that the components of the DC-to-DC converter circuit that perform high frequency switching during converter operation are surface mounted on a circuit board (PCB) so that heat produced from the high frequency switching is approximately equally distributed at least over the portion of the PCB where the components are mounted. Specifically, FIG. 1 illustrates synchronous rectifiers 150. It is the switching of the synchronous rectifiers that produces the dominant portion of the heat to be dissipated of the DC-to-DC converter circuit. Therefore, if this heat is properly managed, that, in conjunction with a higher efficiency DC-to-DC converter circuit, may result in a DC-to-DC converter package without a heat sink. One advantage of surface mounting the synchronous rectifiers, as illustrated, in comparison to, for example, through mounting, is that the rectifiers are in closer proximity to the board itself. This provides several advantages. First, better heat transfer may occur between the components and the board. Likewise, very thin components will typically exhibit lower inductance resulting in a lower impedance or "IR" drop. In addition to reducing the heat, this therefore also may reduce the amount of capacitance to be employed to address the dynamic response of the DC-to-DC converter.

The foregoing advantages may be further improved by employing a conductive plate, such as, for example, a copper plate, such as 110 in FIG. 1, clad to the bottom surface of the PCB. This copper plate, in this particular embodiment, allows the heat to be approximately equally distributed over a wider area, that, therefore, may ultimately reduce the temperature at each location. Likewise, this clad copper plate may enhance the advantages previously described from surface mounting such as better heat transfer and lower impedance/inductance.

In addition to the advantages of surface mounting, as previously indicated, the components, in particular, the switching components, which, in this particular embodiment, comprise the synchronous rectifiers, are mounted so that the heat produced from the high frequency switching is approximately equally distributed at least over the portion of the PCB where the components are mounted. Nonetheless, as previously described, the copper plate clad to the bottom of the PCB also aids in both approximately equally distributing the heat over the area where the components are mounted, and, in addition, increasing the area over which the heat is distributed, thereby reducing the temperature.

Another advantage associated with employing a transformer having a single winding secondary and an output inductor employing a single winding is that the thickness of the transformer and the inductor due to the windings is reduced, as illustrated in FIG. 1. Therefore, the potential benefits previously described, associated with surface mounting the components, may be additionally enhanced because a relatively low number of windings, such as less than five windings, as previously described, are employed. This aspect of this embodiment of the DC-to-DC converter package, namely its relative thickness being less than alternative packages, may be enhanced even further by employing components comprising one level of metal.

Figure 2:
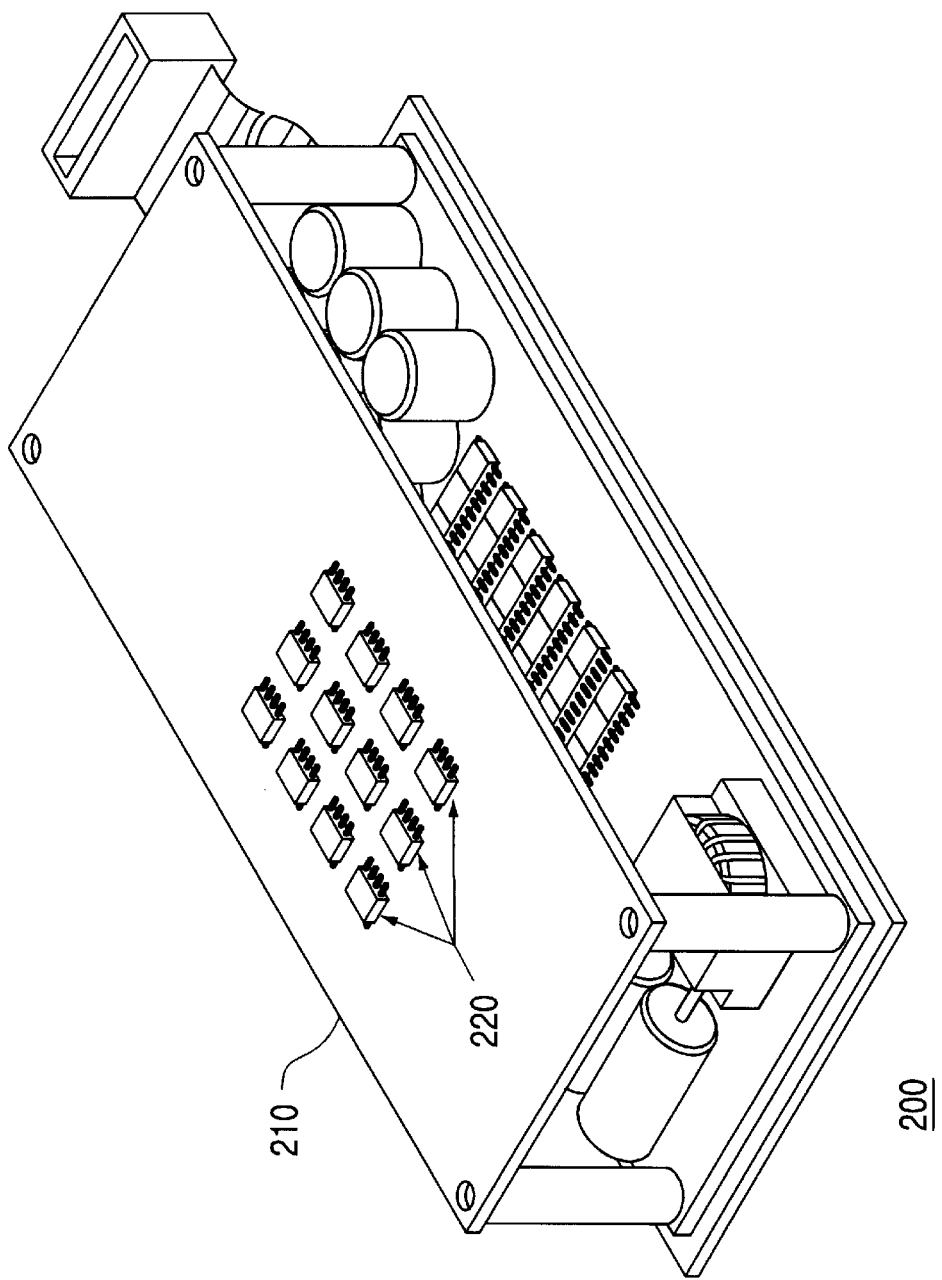
FIG. 2 is a perspective diagram illustrating another embodiment of a DC-to-DC converter package in accordance with the present invention.

FIG. 2 is a perspective diagram illustrating an alternative embodiment of a DC-to-DC converter package in accordance with the present invention. As illustrated, in this particular embodiment a separate or second PCB is employed. Likewise, additional components 220 are surface mounted on the separate or second PCB, 210. In this particular embodiment, although the invention is not limited in scope in this respect, components 210 comprise relatively low power circuitry employed to control the DC-to-DC converter circuit. In this embodiment, the low power circuitry, such as below 100 milli-amps, mainly provides power to control circuitry, power management, and other house-keeping circuitry, other than the switching rectifiers, in this embodiment. One advantage of employing this separate PCB for low power components is that it provides a greater surface area in which to mount those components of the DC-to-DC converter circuit that generate significant amounts of heat from the high frequency switching operation of the synchronous rectifiers. Therefore, this results in better distribution of the heat over a larger surface are in comparison with the embodiment of FIG. 1.

While certain features of the invention have been illustrated as described herein, many modifications, substitutions, changes, and equivalents thereof will now occur to those skill in art. For example, a DC-to-DC converter package in accordance with the present invention, in one embodiment, without limitation, may be employed in a system with a processor, such as a microprocessor, for example. Also, this system may be incorporated into another system, such, for example, without limitation, a server system. It is, therefore, to be understood that the appended claims are intended to cover all such modifications and changes as fall within the true spirit of the invention.

What is claimed is:

1. A DC-to-DC converter package comprising:
   a DC-to-DC converter circuit;
   rectifier components of said DC-to-DC converter circuit that perform high frequency switching during converter operation being surface mounted on at least a portion of a printed circuit board (PCB) so that heat produced from said high frequency switching is approximately equally distributed at least over an area greater than the portion of the PCB where said components are mounted on It said PCB.

2. The DC-to-DC converter package of claim 1, wherein said DC-to-DC converter circuit comprises a high-efficiency DC-to-DC converter circuit.

3. The DC-to-DC converter package of claim 2, wherein a transformer of said DC-to-DC converter circuit has one winding on its secondary.

4. The DC-to-DC converter package of claim 3, wherein said DC-to-DC converter circuit includes an output inductor, the output inductor of the DC-to-DC converter having one winding.

5. The DC-to-DC converter package of claim 2, wherein said DC-to-DC converter circuit comprises a synchronous rectifier converter circuit.

6. The DC-to-DC converter package of claim 5, wherein the synchronous rectifier converter circuit includes a buck converter circuit on the primary of the transformer.

7. The DC-to-DC converter package of claim 2, wherein said surface mounted components comprise one level metal components.

8. The DC-to-DC converter package of claim 2, wherein low-power circuitry of the DC-to-DC converter circuit is mounted on a physically separate PCB.

9. The DC-to-DC converter package of claim 2, wherein a conductive plate is clad to a bottom surface of said PCB.

10. The DC-to-DC converter package of claim 9, wherein the conductive plate comprises a copper plate.

11. A system comprising:
   a processor and a DC-to-DC converter package;
   said DC-to-DC converter package including:
      a DC-to-DC converter circuit;
      the DC-to-DC converter circuit including one winding on the secondary of a transformer;
      the DC-to-DC converter circuit including an output inductor having one winding; and
      rectifier components of the DC-to-DC converter circuit that perform high-frequency switching during converter operation being surface mounted on at least a portion of a printed circuit board (PCB) so that heat produced from said high frequency switching is approximately equally distributed at least over an area greater than the portion of the PCB where said components are mounted on said PCB;
   wherein said DC-to-DC converter package has the capability to dissipate heat during DC-to-DC converter operation without a heat sink.

12. The system of claim 11, wherein said surface mounted components comprise one level metal components.

13. The system of claim 11, wherein a low-power circuitry of the DC-to-DC converter circuit is mounted on a physically separate PCB.

14. The system of claim 11, wherein a conductive plate is clad to a bottom surface of said PCB.

15. The system of claim 14, wherein the conductive plate comprises a copper plate.

* * * * *